United States Patent
Lee et al.

(10) Patent No.: US 7,100,677 B2
(45) Date of Patent: Sep. 5, 2006

(54) INTEGRATED LIQUID COOLING SYSTEM FOR ELECTRICAL COMPONENTS

(75) Inventors: Hsieh Kun Lee, Tu-Chen (TW); Cheng-Tien Lai, Tu-chen (TW); Shi Wen Zhou, Shenzhen (CN)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 10/900,801

(22) Filed: Jul. 27, 2004

(65) Prior Publication Data

US 2005/0061482 A1   Mar. 24, 2005

(30) Foreign Application Priority Data

Sep. 19, 2003   (TW) .............................. 92216907 U

(51) Int. Cl.
*F28F 7/00* (2006.01)
*H05K 7/20* (2006.01)

(52) U.S. Cl. ................................ 165/80.4; 165/104.33; 361/699

(58) Field of Classification Search ............... 165/80.4, 165/80.3, 185, 104.33, 122; 361/698, 699, 361/700; 174/15.1; 257/714, 715, 716
See application file for complete search history.

(56) References Cited

U.S. PATENT DOCUMENTS

| | | | |
|---|---|---|---|
| 4,561,040 A * | 12/1985 | Eastman et al. ............ | 361/699 |
| 6,064,572 A * | 5/2000 | Remsburg .................... | 361/700 |
| 6,263,957 B1 * | 7/2001 | Chen et al. ................. | 165/80.4 |
| 6,439,298 B1 * | 8/2002 | Li .......................... | 165/104.33 |
| 6,702,002 B1 * | 3/2004 | Wang ........................ | 165/80.3 |
| 2002/0189791 A1 * | 12/2002 | Yang et al. ................. | 165/80.4 |
| 2004/0182544 A1 * | 9/2004 | Lee et al. ................... | 165/80.4 |

FOREIGN PATENT DOCUMENTS

| | | |
|---|---|---|
| CN | 98248834.3 | 11/1999 |
| CN | 99210734.2 | 4/2000 |
| CN | 2507138 | 8/2002 |
| CN | 2508394 | 8/2002 |
| TW | 459981 | 10/2001 |
| TW | 483727 | 4/2002 |
| TW | 504023 | 9/2002 |
| TW | 516815 | 1/2003 |

* cited by examiner

*Primary Examiner*—Tho Duong
(74) *Attorney, Agent, or Firm*—Wei Te Chung

(57) ABSTRACT

A liquid cooling system includes a tank (10) for thermally contacting a heat source (100), a cylindrical heat dissipating unit (20) mounted on the tank, and a pump (30) located within the cylindrical heat dissipating unit. The tank defines a cavity therein for containing liquid coolant for heat exchange, and an inlet (122) in communication with the cavity. The heat dissipating unit defines a chamber therein in flow communication with the cavity, and an outlet (275) in communication with the chamber. The pump has an entrance (31) in flow communication with the outlet, and an exit (32) in flow communication with the inlet, thereby the tank, the heat dissipating unit, and the pump together forming a loop for circulation the of liquid coolant.

21 Claims, 3 Drawing Sheets

INTEGRATED LIQUID COOLING SYSTEM FOR ELECTRICAL COMPONENTS

BACKGROUND OF THE INVENTION

1. Field of the Invention

The present invention relates generally to cooling systems, and more particularly to a liquid cooling system for rapidly cooling an electrical component such as a Central Processing Unit (CPU).

2. Related Art

With the continuing development of computer electronics technology, new electronic packages such as the latest CPUs can perform more and more functions. Heat generated by these modern electronic packages has increased commensurately. The heat must be removed from the CPUs to prevent them becoming unstable or being damaged. The traditional cooling means such as combined heat sinks and cooling fans are increasingly unable to provide satisfactory cooling performance. Under such circumstances, cooling system using liquid cooling technology is thus developed for cooling the CPUs.

Chinese patent numbers 98248834.3 and 99210734.2 respectively disclose such a kind of cooling system. This kind of cooling system generally comprises a cooling base contact the CPU for absorbing heat generated by the CPU. The cooling base generally defines a cavity for receiving liquid coolant therein, and an inlet and an outlet both in communication with the cavity. The cooling system also comprises a heat sink and a pump arranged at proper places within a computer enclosure. A first tube connects the inlet of the cooling base and the pump, so that the coolant enters the cavity along the first tube. A second tube connects the outlet of the cooling base and the pump, so that the heated coolant exits from the cavity along the second tube. The second tube extends through the heat sink, whereupon heat of the heated coolant is transferred to the heat sink to radiate to ambient air. Thus, the heat of the CPU is continuously taken away by circulation of the coolant.

However, the cooling base, the tubes, the heat sink, and the pump are discrete components prior to attachment within the computer enclosure. Installation and removal of the cooling system can be troublesome and problematic. In addition, a large space for receiving these discrete components is required. This militates against the trend of electrical devices becoming more and more smaller.

SUMMARY OF THE INVENTION

Accordingly, an object of the present invention is to provide a liquid cooling system which occupies a relatively small space.

Another object of the present invention is to provide a liquid cooling system which can be readily installed or removed to or from an electrical enclosure.

To achieve the above-mentioned objects, a liquid cooling system in accordance with a preferred embodiment of the present invention comprises a tank for thermally contacting a heat source, a cylindrical heat dissipating unit mounted on the tank, and a pump located within the cylindrical heat dissipating unit. The tank defines a cavity therein for containing liquid coolant for heat exchange, and an inlet in communication with the cavity. The heat dissipating unit defines a chamber therein in flow communication with the cavity, and an outlet in communication with the chamber. The pump has an entrance in flow communication with the outlet, and an exit in flow communication with the inlet, thereby the tank, the heat dissipating unit, and the pump together forming a loop for circulation the of liquid coolant.

Other objects, advantages and novel features of the present invention will be drawn from the following detailed description of the preferred embodiment of the present invention with attached drawings, in which:

DESCRIPTION OF THE PREFERRED EMBODIMENTS

Figure 1:
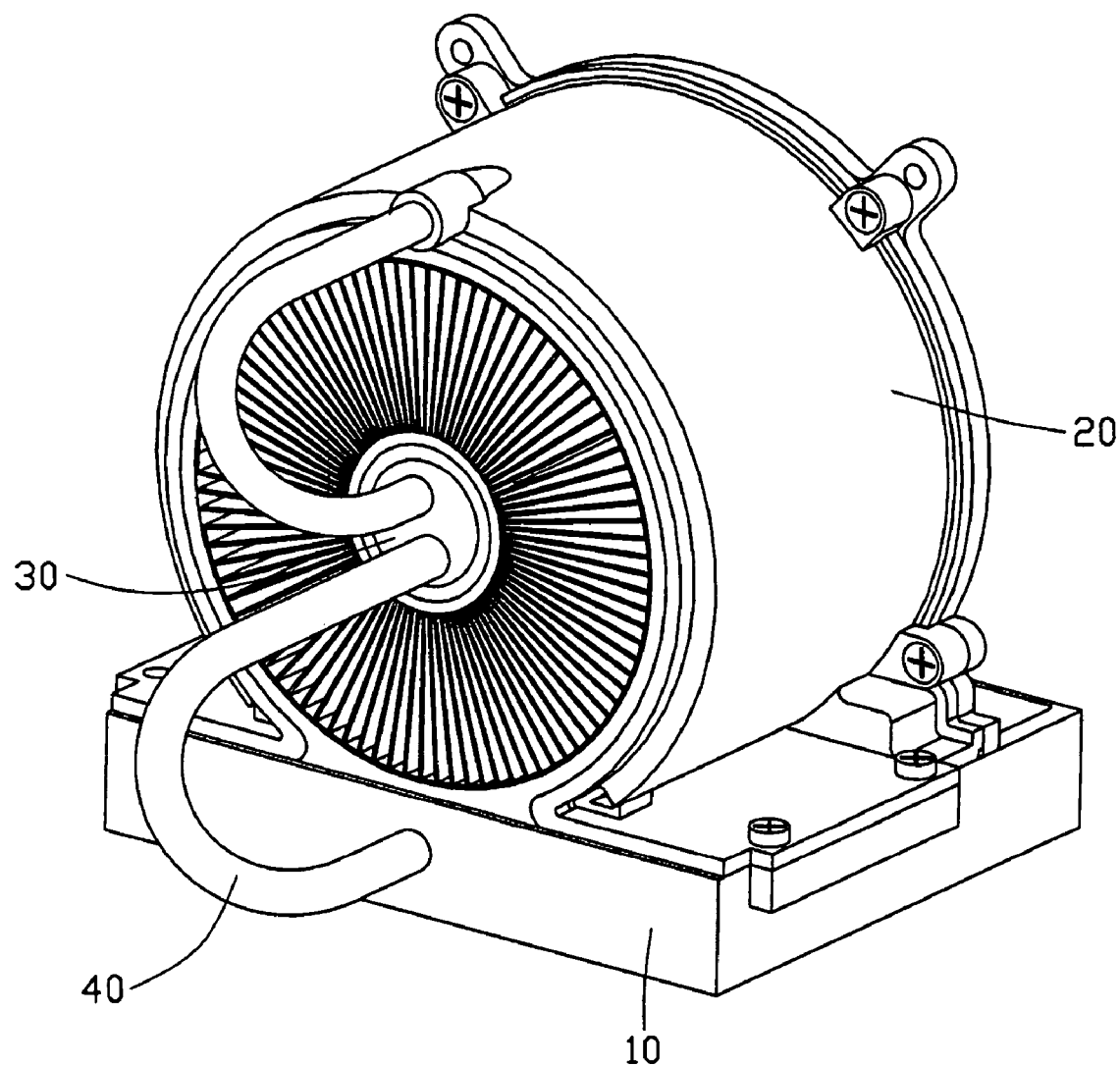
FIG. 1 is an assembled, isometric view of a liquid cooling system in accordance with the preferred embodiment of the present invention.

FIG. 1 illustrates a liquid cooling system in accordance with a preferred embodiment of the present invention. The liquid cooling system comprises a tank 10 containing liquid coolant therein, a heat dissipating unit 20 attached above the tank 10, a pump 30 located in the heat dissipating unit 20, and two pipes 40 connecting the pump 30 to the tank 10 and the heat dissipating unit 20 respectively.

Figure 2:
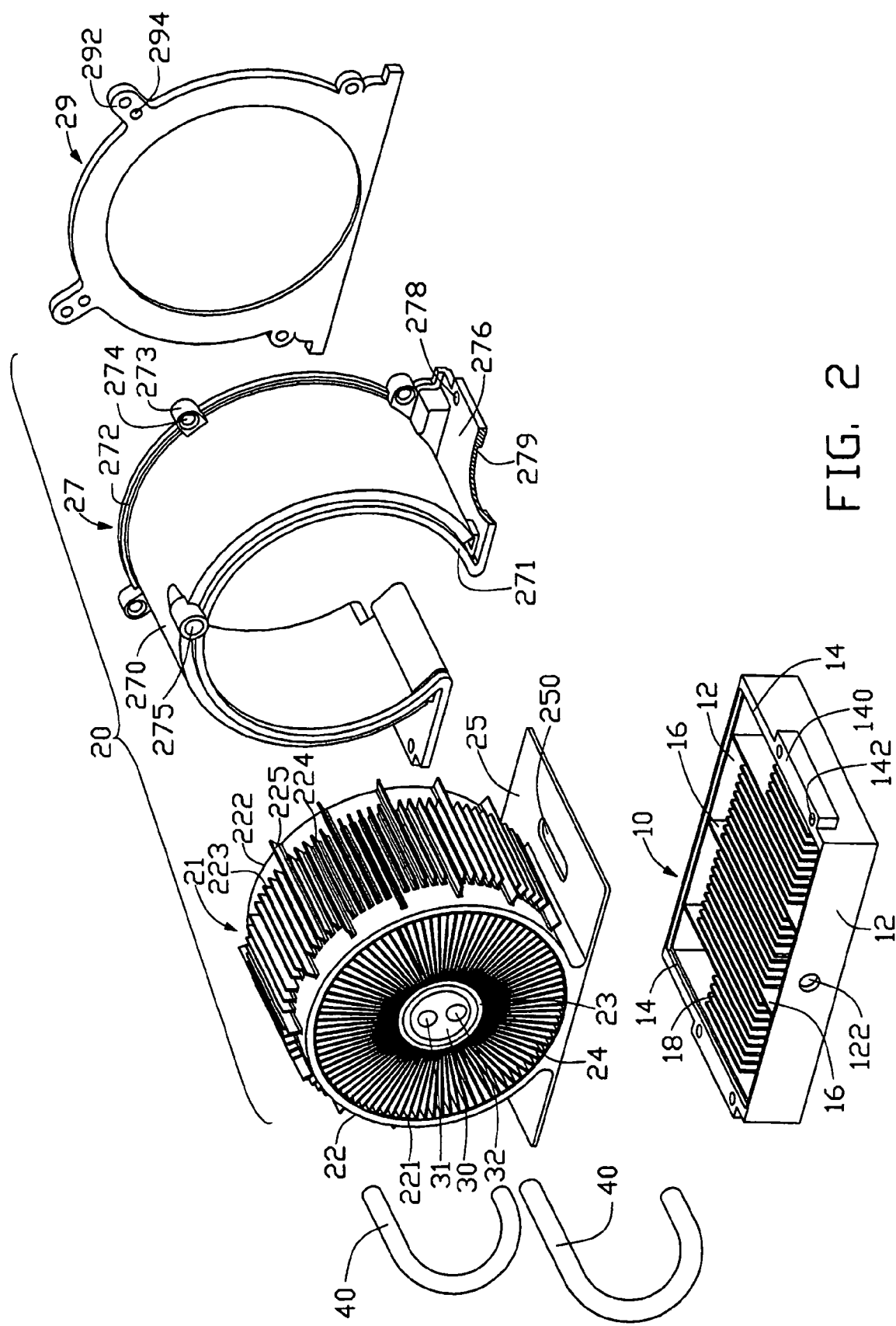
FIG. 2 is an exploded, isometric view of the liquid cooling system of FIG. 1.
Figure 3:
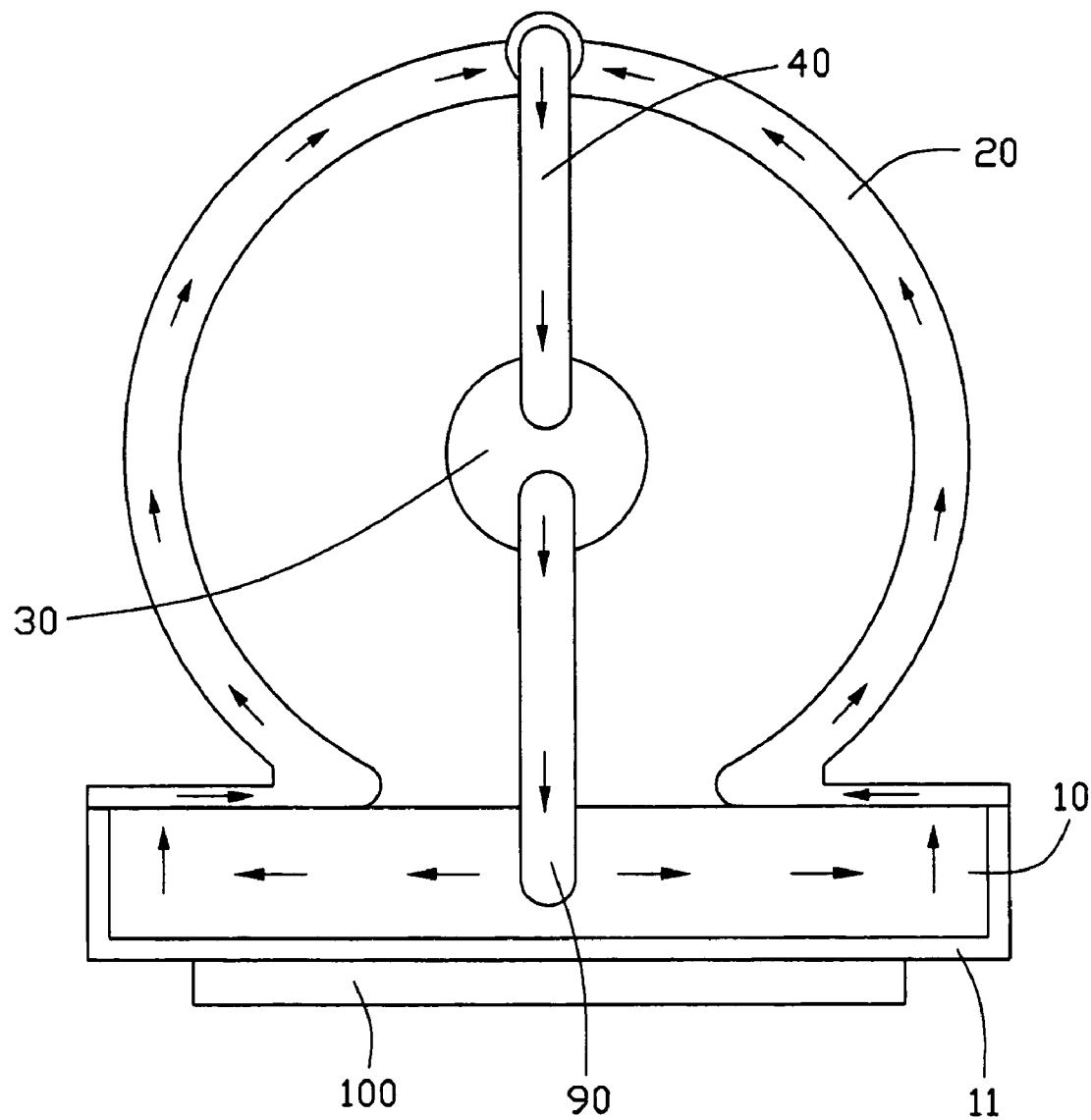
FIG. 3 is a schematic, side elevational view of the liquid cooling system of FIG. 1 with some elements omitted, mainly showing circulation of liquid coolant therein.

Referring to FIGS. 2 and 3, the tank 10 has a bottom base 11, for thermally contacting a heat generating component 100. Two pairs of sidewalls 12, 14 extend perpendicularly upwardly from the bottom base 11, whereby the tank 10 is substantially parallelepiped-shaped. In alternative embodiments of the present invention, the tank 10 can have other suitable shapes, such as be cylindrical. The bottom base 11, and the sidewalls 12, 14 cooperatively defines a cavity (not labeled) therebetween. An inlet 122 is defined in a middle of one sidewall 12, in communication with the cavity. A mounting block 140 extends outwardly from top sides of the sidewalls 14. A pair of mounting apertures 142 is defined in each mounting block 140.

A plurality of parallel, evenly spaced spacing walls 16 is formed in the tank 10. The spacing walls 16 extend alternately from one sidewall 12 and an opposite sidewall 12. A height of the spacing walls 16 is substantially equal to a height of the sidewalls 12, 14. A distance between a free end of each spacing wall 16 and a corresponding opposite sidewall 12 is substantially equal to a distance between any two adjacent spacing walls 16. A zigzagged channel (not labeled) having a substantially uniform width is thereby defined in the tank 10, for flow of the liquid coolant. The channel has two symmetrical sections for guiding the liquid coolant to flow from the inlet 122 to near the sidewalls 12 respectively.

A plurality of parallel, evenly spaced inner walls 18 extends upwardly from the bottom base 11 into the channel. Each inner wall 18 spaces the opposite sidewalls 12 at both free ends. A distance between each free end of each inner wall 18 and a corresponding sidewall 12 is equal to the distance between the free end of each spacing wall 16 and the opposite sidewall 12. In the preferred embodiment of the present invention, a height of the inner walls 18 is substantially the same as the height of the spacing walls 16. In alternative embodiments of the present invention, the height of the inner walls 18 is less than the height of the spacing walls 16.

The heat dissipating unit 20 comprises a cooling body 21, a sleeve 27 surrounding the cooling body 21, and an end lid 29 attached to the sleeve 27.

The cooling body 21 comprises a cylinder 22, and a cover plate 25 formed at an outer periphery of the cylinder 22. A pair of slot 250 is defined in the cover plate 25 near opposite sides respectively. The cover plate 25 is used to be hermetically mounted on top sides of the sidewalls 12, the spacing walls 16, and the inner walls 18. The channels are thus enclosed at top sides thereof, thereby forming a passageway for flow of liquid coolant from the inlet 122 to the slots 125 of the cover plate 25 respectively. In the preferred embodiment of the present invention, the cover plate 25 is attached to the tank 10 by means of soldering. Other suitable means such as adhesive may be alternatively used.

The cylinder 22 has opposite first and second ends 221, 222. A plurality of evenly spaced first ribs 223 and second ribs 225 are radially, outwardly and alternately formed on the outer periphery of the cylinder 22, parallel to a central axis of the cylinder 22. Each first rib 223 spaces the first end 221 a small distance, and spaces the second end 222 a relative large distance. A distance between any two adjacent first and second ribs 223, 225 is substantially equal to said relatively large distance. Each second rib 225 extends from the second end 222 to near the first end 221. An axial distance between ends of the first and second ribs 223, 225 that is toward the first end 221 is equal to said relatively large distance.

A plurality of heat-conducting fins 224 is formed on the outer periphery of the cylinder 22, between any two adjacent first and second ribs 223, 225. Each heat-conducting fin 224 spaces the first and second ends 221, 222 said relatively large distance. In the preferred embodiment of the present invention, a height of the heat-conducting fins 224 is substantially equal to the height of the ribs 223. Free edges of the ribs 223 and the heat-conducting fins 224 together forms a hypothetical cylinder that has a greater diameter than that of the cylinder 22. In alternative embodiments of the present invention, the height of the heat-conducting fins 224 is less than the height of the ribs 223.

A mounting bracket 23 is formed at a center hollow portion of the cylinder 22, for mounting the pump 30 therein. The pump 30 has an entrance 31, and an exit 32 for being connected to the inlet 122 of the tank 10 by one of the two pipes 40. A plurality of cooling fins 24 is radially formed between an inner periphery of the cylinder 22 and the mounting bracket 23.

The sleeve 27 is used to surround the cylinder 22 to form a closed chamber therebetween for heat exchange. The sleeve 27 comprises a cylindrical main portion 270 corresponding to the hypothetical cylinder defined by the free edges of the ribs 223 and the heat-conducting fins 224, and a pair of mounting plate 276 extending from the main portion 270, parallel and corresponding to the cover plate 25 of the cooling body 21. A circular, inward flange 271 is formed at a first end of the main portion 270, for engaging with the first end 221 of the cylinder 22. A width of the inward flange 271 along the central axis of the cylinder 22 is substantially equal to said small distance between the first ribs 223 and the first end 221. A circular, outward flange 272 is formed at an opposite second end of the main portion 270, for mounting of the end lid 29. An outlet 275 is defined in a middle of the main portion 270 at the first end thereof, for being connected to the entrance 31 of the pump 30 by the other of the two pipes 40.

When the sleeve 27 surrounds the cylinder 22, the inward flange 270 surroundingly engages with the first end 221 of the cylinder 22 to seal the chamber at the first end 221, the end lid 29 engages with the outward flange 272 and the second end 222 of the cylinder 22 to seal the chamber at the second end 222, and the outlet 275 communicates with the chamber. The ribs 223 and the heat-conducting fins 224 abut the inner periphery of the main portion 270, and the inward flange 271 abuts the end of the first rib 223 adjacent the first end 221. A zigzagged channel (not labeled) having a substantially uniform width is thereby defined in the chamber. The channel has two symmetrical sections for guiding the liquid coolant to flow from near the cover plate 25 to the outlet 275 respectively.

The end lid 29 can be attached to the sleeve 27 by a variety of suitable means. In the preferred embodiment of the present invention, a plurality of protrusions 273 each defining a though hole 273 therein is formed along the outward flange 272 of the sleeve 27. The end lid 29 forms a plurality of protrusions 292 each defining a mounting hole therein, coinciding with the through holes 274 of the sleeve 27. Using a plurality of fasteners, such as screws extending through the through hole 274 into the mounting holes 294, the end lid 29 can be fastened to the sleeve 27.

Each mounting plate 276 defines a pair of fastening holes 278, coinciding with the mounting apertures 142 of the tank 10. Using two pairs of fasteners, such as screws extending though the fastening holes 278 into the mounting apertures 142, the mounting plate 276 can be fastened to the tank 10.

When fastened to the tank 10, each mounting plate 276 abuts the cover plate 25 of the cooling body 21. In order for each slot 250 to be in flow communication with the chamber, each mounting plate 276 forms a groove 279 at an underside thereof, corresponding to the slot 250 of the cover plate 25. The liquid coolant can exit the tank 10 via the slot 250, and enter the chamber via the groove 279.

Referring to FIG. 3, in operation of the liquid cooling system, heat is transferred from the heat generating component 100 to the bottom base 11 of the tank 10, and then conducted to the liquid coolant. The heat is then transferred from the coolant to the cylinder 22 of the heat dissipating unit 20 as the coolant flows from the tank 10 to the chamber of the heat dissipating unit 20 via the grooves 279 in two branches. The heat is then conducted to the cooling fins 24, whereupon the heat is radiated to ambient air. Circulation of the coolant continuously takes the heat away from the bottom base 11 and conducts the heat to the heat dissipating unit 20. Because the cylinder 22 and the cooling fins 24 have relatively large surface areas, the heat of the heat generating component 100 can be rapidly radiated to the ambient air.

In the present invention, the tank 10, the heat dissipating unit 20, and the pump 30 of the liquid cooling system are greatly integrated. Therefore, installation or removal of the liquid cooling system is simplified. In addition, the space required to install the cooling system is accordingly reduced.

It is understood that the invention may be embodied in other forms without departing from the spirit thereof. The above-descinner walled examples and embodiments are to be considered in all respects as illustrative and not restrictive, and the invention is not to be limited to the details given above.

The invention claimed is:

1. A liquid cooling system comprising:
   a tank for thermally contacting a heat source, the tank defining a cavity therein for containing liquid coolant for heat exchange, and an inlet in communication with the cavity;
   a cylindrical heat dissipating unit mounted on the tank, the hear dissipating unit defining a chamber therein, and an outlet in communication with the chamber, the chamber being in flow communication with the cavity; and a pump located within the heat dissipating unit, the pump defining an entrance in flow communication with the outlet, and an exit in flow communication with the inlet;

wherein the heat dissipating unit comprises a cooling body, a sleeve surrounding the cooling body, and an end lid attached to the sleeve, the chamber being defined between the cooling body and the sleeve;

wherein the cooling body comprises a cylinder having opposite first and second ends, and a cover plate formed on the cylinder for covering the tank;

wherein the sleeve comprises an inward flange at one end thereof, the inward flange engages with the first end of the cylinder to seal the chamber at the first end, and the end lid engages with the second end of the cylinder and an opposite end of the sleeve to the chamber at the second end; and wherein the sleeve further comprises a mounting plate extending therefrom, the mounting plates being attached to the tank and abutting the cover plate, the cover plate defines a slot communicating with the cavity, and the mounting plate defines a groove at an underside thereof in communication with both the slot and the chamber.

2. The liquid cooling system as described in claim 1, wherein the tank comprises a bottom base, and a plurality of sidewalls extending from the bottom base, the bottom base and the sidewalls cooperatively defining the cavity therebetween.

3. The liquid cooling system as described in claim 2, wherein the tank comprises a plurality of spacing walls extending alternately from one sidewall and an opposite sidewall, a free end of each of the spacing walls spaces a corresponding sidewall a distance, thereby forming a zigzagged channel in the tank for flow of liquid coolant.

4. The liquid cooling system as described in claim 3, wherein the tank comprises a plurality of inner walls arranged between two adjacent spacing walls.

5. The liquid cooling system as described in claim 3, wherein the inlet is formed at a middle of one sidewall, and the channel has two symmetrical sections about the inlet for guiding the liquid coolant to flow from the inlet to two different positions respectively.

6. The liquid cooling system as described in claim 1, wherein the cylinder comprises a plurality of first and second ribs radially and alternately arranged on an outer periphery thereof, the first and second ribs abutting the sleeve thereby funning a zigzagged channel therein for flow of the liquid coolant.

7. The liquid cooling system as described in claim 6, wherein each of the first ribs spaces the first end a small first distance, and spaces the second end a larger second distance.

8. The liquid cooling system as described in claim 7, wherein the second ribs extend from the second end to near the first end, and a distance between the second ribs and the first end is equal to said larger second distance.

9. The liquid cooling system as described in claim 6, wherein the outlet is formed at the middle of the main portion at the first end, and the channel in the chamber has two symmetrical sections about the outlet for guiding the liquid coolant to flow from two different positions to the outlet.

10. The liquid cooling system as described in claim 1, further comprising a plurality of cooling fins thermally connected to the cylinder at an inner periphery thereof.

11. A liquid cooling system comprising:

a tank filled with liquid coolant therein, the tank forming an inlet via which the liquid coolant enters the tank, and two paths extending between the inlet and two different positions to distribute the liquid coolant to said two different positions respectively;

a hear dissipating unit mounted on the tank, the heat dissipating unit defining a chamber therein containing the liquid coolant, and an outlet via which the liquid coolant exits the chamber, the chamber being in flow communicating with tank at said two different positions, the heat dissipating unit defining two paths in the chamber extending between the outlet and another two different positions corresponding to said two different positions to converge the liquid coolant from said another two different positions to the outlet; and a pump having an entrance in flow communication with the outlet, and an exit in flow communication with the inlet, so that the liquid coolant can be driven to flow between the tank and the heat dissipating unit;

wherein the heat dissipating unit comprises a cylinder, and a cylindrical sleeve surrounding the cylinder, the chamber being defined between an outer periphery of the cylinder and an inner periphery of the sleeve; and wherein the cylinder forms a bracket at a center hollow portion thereof to position the pump threat, and a plurality of cooling fins radially arranged between the bracket and an inner periphery of the cylinder.

12. A liquid cooling system comprising:

a tank for thermally contacting a heat source, the tank defining a cavity therein for containing liquid coolant for heat exchange, and an inlet in communication with the cavity;

a cylindrical heat dissipating unit mounted on the tank, the heat dissipating unit defining a chamber therein, and an outlet in communication with the chamber, the chamber being in flow communication with the cavity; and a pump located within the heat dissipating unit, the pump defining an entrance in flow communication with the outlet, and an exit in flow communication with the inlet;

wherein the tank comprises a bottom base, and a plurality of sidewalls extending from the bottom base, the bottom base and the sidewalk cooperatively defining the cavity therebetween;

wherein the tank comprises a plurality of spacing walls extending alternately from one sidewall and an opposite sidewall, a free end of each of the spacing walls spaces a corresponding sidewall a distance, thereby forming a zigzagged channel in the tank for flow of liquid coolant; and wherein the inlet is formed at a middle of one sidewall, and the channel has two symmetrical sections about the inlet for guiding the liquid coolant to flow from the inlet to two different positions respectively.

13. The liquid cooling system as described in claim 12, wherein the tank comprises a plurality of inner walls arranged between two adjacent spacing walls.

14. The liquid cooling system as described in claim 12, wherein the heat dissipating unit comprises a cooling body, a sleeve surrounding the cooling body, and an end lid attached to the sleeve, the chamber being defined between the cooling body and the sleeve.

15. The liquid cooling system as described in claim 14, wherein the cooling body comprises a cylinder having opposite first and second ends, and a cover plate formed on the cylinder for covering the tank.

16. The liquid cooling system as described in claim 15, wherein the sleeve comprises an inward flange at one end thereof, the inward flange engages with the first end of the cylinder to seal the chamber at the first end, and the end lid engages with the second end of the cylinder and an opposite end of the sleeve to seal the chamber at the second end.

17. The liquid cooling system as described in claim 15, wherein the cylinder comprises a plurality of first and second ribs radially and alternately arranged on an outer periphery thereof, the first and second ribs abutting the sleeve thereby forming a zigzagged channel therein for flow of the liquid coolant.

18. The liquid cooling system as described in claim 17, wherein each of the first ribs spaces the first end a small first distance, and spaces the second end a larger second distance.

19. The liquid cooling system as described in claim 18, wherein the second ribs extend from the second end to near the first end, and a distance between the second ribs and the first end is equal to said larger second distance.

20. The liquid cooling system as described in claim 17, wherein the outlet is formed at the middle of the main portion at the first end, and the channel in the chamber has two symmetrical sections about the outlet for guiding the liquid coolant to flow from two different positions to the outlet.

21. The liquid cooling system as described in claim 15, further comprising a plurality of cooling fins thermally connected to the cylinder at an inner periphery thereof.

* * * * *